United States Patent
Uchida

(10) Patent No.: US 12,104,116 B2
(45) Date of Patent: Oct. 1, 2024

(54) THERMALLY CONDUCTIVE ELASTOMER COMPOSITION AND THERMALLY CONDUCTIVE MOLDED ARTICLE

(71) Applicant: KITAGAWA INDUSTRIES CO., LTD., Aichi (JP)

(72) Inventor: Tatsuya Uchida, Kasugai (JP)

(73) Assignee: KITAGAWA INDUSTRIES CO., LTD., Aichi (JP)

( * ) Notice: Subject to any disclaimer, the term of this patent is extended or adjusted under 35 U.S.C. 154(b) by 525 days.

(21) Appl. No.: 17/619,041

(22) PCT Filed: Apr. 22, 2020

(86) PCT No.: PCT/JP2020/017301
§ 371 (c)(1),
(2) Date: Dec. 14, 2021

(87) PCT Pub. No.: WO2020/261737
PCT Pub. Date: Dec. 30, 2020

(65) Prior Publication Data
US 2022/0290027 A1    Sep. 15, 2022

(30) Foreign Application Priority Data

Jun. 28, 2019    (JP) .................. 2019-121467

(51) Int. Cl.
*C09K 5/14*    (2006.01)
*C08L 91/00*   (2006.01)
*H01L 23/36*   (2006.01)

(52) U.S. Cl.
CPC ............... *C09K 5/14* (2013.01); *C08L 91/00* (2013.01); *C08L 2207/322* (2013.01); *H01L 23/36* (2013.01)

(58) Field of Classification Search
CPC ..... C09K 5/14; C08L 91/00; C08L 2207/322; C08L 25/08; C08L 53/02; H01L 23/36;
(Continued)

(56) References Cited

U.S. PATENT DOCUMENTS

| 2019/0127621 A1 | 5/2019  | Uchida       |
| 2019/0367724 A1 | 12/2019 | Hisasue et al. |
| 2020/0354619 A1 | 11/2020 | Uchida et al.  |

FOREIGN PATENT DOCUMENTS

| JP | 2006-176766 | 7/2006 |
| JP | 2008-163145 | 7/2008 |

(Continued)

OTHER PUBLICATIONS

English Translation of JP2015193785 (Year: 2015).*
International Search Report (ISR) issued Jul. 7, 2020 in International (PCT) Application No. PCT/JP2020/017301.

*Primary Examiner* — Andrew J. Oyer
(74) *Attorney, Agent, or Firm* — Wenderoth, Lind & Ponack, L.L.P.

(57) ABSTRACT

A thermally conductive elastomer composition of the present invention contains: 100 parts by mass of a styrene-based elastomer; from 610 to 750 parts by mass of a process oil formed of a petroleum-based hydrocarbon, the a process oil having a weight average molecular weight of not greater than 600; from 25 to 40 parts by mass of a solid nonionic surfactant having an HLB value of 2.0 or greater; from 260 to 640 parts by mass of aluminum hydroxide powder; and from 250 to 340 parts by mass of artificial graphite powder.

4 Claims, 2 Drawing Sheets

(58) Field of Classification Search
CPC ............... H01L 23/373; H01L 23/3737; H01L 23/42; C08K 3/04; C08K 3/22
See application file for complete search history.

(56) References Cited

FOREIGN PATENT DOCUMENTS

| | | |
|---|---|---|
| JP | 2013-104046 | 5/2013 |
| JP | 2015-193785 | 11/2015 |
| JP | 2018-80235 | 5/2018 |
| JP | 2019-119752 | 7/2019 |
| WO | 2018/139122 | 8/2018 |

\* cited by examiner

THERMALLY CONDUCTIVE ELASTOMER COMPOSITION AND THERMALLY CONDUCTIVE MOLDED ARTICLE

TECHNICAL FIELD

The present invention relates to a thermally conductive elastomer composition and a thermally conductive molded article.

BACKGROUND ART

As disclosed in Patent Document 1, for example, a thermally conductive molded article that includes a thermally conductive filler, with using a styrene-based elastomer as a base polymer, has been used as a member for releasing a heat generated from an electronic component and the like in an electronic device to the outside, A thermally conductive molded article of this type is used, for example, by being interposed between an electronic component mounted on a substrate and a heat radiator such as a heat radiation plate, to transfer a heat generated from the electronic component to the heat radiator.

CITATION LIST

Patent Literature

Patent Document 1: JP 2018-80235A

Technical Problem

In some cases, known thermally conductive molded articles have problems in reworkability. For example, when overlapped, the thermally conductive molded articles may adhere to each other and cannot be peeled away from each other.

Also, in a known thermally conductive molded article, an amount of oil component contained in the thermally conductive molded article that oozes to the outside (an amount of oil bleeding) can be large, which is problematic.

SUMMARY OF INVENTION

An object of the present invention is to provide a thermally conductive elastomer composition and a thermally conductive molded article that have excellent reworkability and oil bleeding resistance.

Solution to Problem

As a result of diligent research to achieve the aforementioned object, the present inventors have found that a thermally conductive elastomer composition containing: a styrene-based elastomer; a process oil formed of a petroleum-based hydrocarbon, the process oil having a weight average molecular weight of not greater than 600; a nonionic surfactant having an HLB value of 2.0 or greater; aluminum hydroxide powder; and artificial graphite powder has excellent reworkability and oil bleeding resistance, and the like, and thus completed the present invention.

A solution to the above problems is as follows. Specifically,

<1> A thermally conductive elastomer composition containing:
100 parts by mass of a styrene-based elastomer;
from 610 to 750 parts by mass of a process oil formed of a petroleum-based hydrocarbon, the process oil having a weight average molecular weight of not greater than 600;
from 25 to 40 parts by mass of a solid nonionic surfactant having an HLB value of 2.0 or greater;
from 260 to 640 parts by mass of aluminum hydroxide powder; and from 250 to 340 parts by mass of artificial graphite powder.
<2> The thermally conductive elastomer composition according to <1>, wherein the aluminum hydroxide powder has an average particle size from 1 μm to 30 μm; and the artificial graphite powder has an average particle size from 8 μm to 30 μm.
<3> The thermally conductive elastomer composition according to <1> or <2>, which does not contain an olefin-based resin.
<4> A thermally conductive molded article obtained by molding the thermally conductive elastomer composition according to any one of <1> to <3>.

Advantageous Effects of Invention

The present invention can provide a thermally conductive elastomer composition and a thermally conductive molded article that have excellent reworkability and oil bleeding resistance.

DESCRIPTION OF EMBODIMENTS

Thermally Conductive Elastomer Composition

Figure 1:
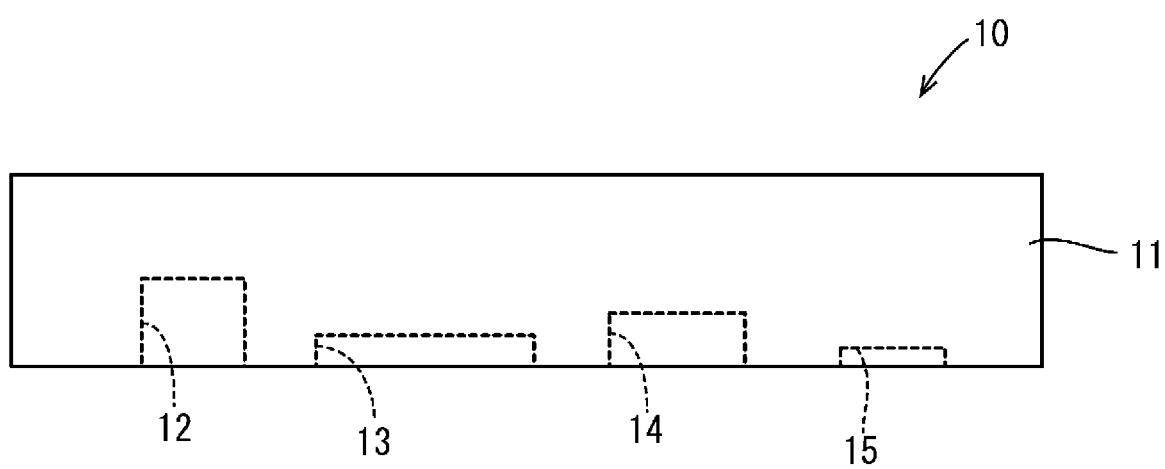
FIG. 1 is a side view schematically illustrating an example of a thermally conductive molded article.

A thermally conductive elastomer composition of the present embodiment contains: 100 parts by mass of a styrene-based elastomer; from 610 to 750 parts by mass of a process oil formed of a petroleum-based hydrocarbon, the process oil having a weight average molecular weight of not greater than 600; from 25 to 40 parts by mass of a nonionic surfactant having an HLB value of 2.0 or greater; from 260 to 640 parts by mass of aluminum hydroxide powder; and from 250 to 340 parts by mass of artificial graphite powder. Each material constituting the thermally conductive elastomer composition will be described below.

Styrene-Based Elastomer

A styrene-based elastomer is a base polymer of a thermally conductive elastomer composition, and is preferably provided with thermal plasticity and appropriate elasticity. Examples of the styrene-based elastomer include a hydrogenated styrene-isoprene-butadiene block copolymer (SEEPS), a styrene-isoprene-styrene block copolymer (SIS), a styrene-isobutylene copolymer (SIBS), a styrene-butadiene-styrene block copolymer (SBS), a styrene-ethylene-propylene block copolymer (SEP), a styrene-ethylene-butylene-styrene block copolymer (SEBS), a styrene-ethylene-propylene-styrene block copolymer (SEPS). These may be used alone or in a combination of two or more.

The styrene-based elastomer is preferably obtained by hydrogenating a block copolymer formed of a polymer block A containing at least two vinyl aromatic compounds as a main constituent and a polymer block B containing at least one type of conjugated diene compound.

Examples of the vinyl aromatic compound include styrene, α-methylstyrene, o-methylstyrene, m-methylstyrene, p-methylstyrene, 1,3-dimethylstyrene, vinylnaphthalene, and vinyl anthracene. Among these, styrene and α-methylstyrene are preferable. One type of aromatic vinyl compound may be used alone, or two or more types thereof may be used in combination.

The content of the vinyl aromatic compound in the styrene-based elastomer is preferably from 5% to 75% by mass, and more preferably from 5% to 50% by mass. When the content of the vinyl aromatic compound is within this range, elasticity of the thermally conductive elastomer composition is easily ensured.

Examples of the conjugated diene compound include butadiene, isoprene, 2,3-dimethyl-1,3-butadiene, 1,3-pentadiene, and 1,3-hexadiene. One type of conjugated diene compound may be used alone, or two or more types thereof may be used in combination. Among these, the conjugated diene compound is preferably at least one selected from isoprene and butadiene, and more preferably a mixture of isoprene and butadiene.

In the styrene-based elastomer, a carbon-carbon double bond derived from the conjugated diene compound of the polymer block B is preferably hydrogenated by 50% or greater, more preferably hydrogenated by 75% or greater, and particularly preferably hydrogenated by 95% or greater.

The styrene-based elastomer may contain at least one polymer block A and at least one polymer block B, and from the viewpoint of heat resistance, mechanical properties, or the like, it is preferable to contain two or more polymer blocks A and one or more polymer blocks B. A bond style of the polymer block A and the polymer block B may be linear, branched, or any combination thereof; however, when the polymer block A is represented by A and the polymer block B is represented by B, a triblock structure represented by A-B-A and a multiblock copolymer represented by (A-B)n and (A-B)n-A (here, n represents an integer of 2 or greater) can be exemplified, and among them, those having a triblock structure represented by A-B-A are particularly preferable in terms of heat resistance, mechanical properties, handleability, and the like.

A weight average molecular weight of the styrene-based elastomer is preferably, from 80000 to 400000, and more preferably, from 100000 to 350000. Note that the weight average molecular weight herein is a weight average molecular weight in terms of standard polystyrene measured by gel permeation chromatography (GPC). The measurement conditions of the weight average molecular weight are as follows.

Measurement Conditions
GPC: LC Solution (available from SIMADU)
Detector: Differential refractometer RID-10A (available from SHIMADU)
Column: TSK gel G4000Hxl in two series (available from Tosoh)
Guard column: TSK guard column Hxl-L (available from Tosoh)
Solvent: Tetrahydrofuran
Temperature: 40° C.
Flow rate: 1 ml/min
Concentration: 2 mg/ml The styrene-based elastomer is particularly preferably SEEPS. As a commercially available product of SEEPS, for example, SEPTON (trade name) 4033, 4044, 4055, 4077, and 4099 available from Kuraray Co., Ltd. can be used. Among these, from the perspective of miscibility, moldability, and the like with other materials, SEPTON (trade name) 4055 (weight average molecular weight: 270000) is particularly preferable.

Process Oil

The process oil is provided with a function of softening a styrene-based elastomer (for example, SEEPS), and is formed of a petroleum-based hydrocarbon having a weight average molecular weight of not greater than 600. The petroleum-based hydrocarbon is not particularly limited as long as the object of the present invention is not impaired, and for example, a paraffin-based hydrocarbon compound is preferable. That is, the process oil is preferably a paraffin-based process oil. If the process oil has a weight average molecular weight of not greater than 600, excellent reworkability and oil bleeding resistance are obtained (the amount of oil bleeding is suppressed). Note that a lower limit of the weight average molecular weight of the process oil is not particularly limited as long as the object of the present invention is not impaired, but, for example, is preferably 400 or greater, and more preferably 450 or greater. Specific examples of the paraffin-based process oil include "Diana Process Oil PW-90 (weight average molecular weight: 533)" (available from Idemitsu Kosan Co., Ltd.).

In the thermally conductive elastomer composition, the process oil is blended in an amount of: 610 parts by mass or greater, preferably 620 parts by mass or greater, and more preferably 630 parts by mass or greater, and not greater than 750 parts by mass, preferably not greater than 730 parts by mass, and more preferably not greater than 710 parts by mass relative to 100 parts by mass of the styrene-based elastomer. When the process oil is blended in the amount within the range specified above, excellent reworkability and oil bleeding resistance are obtained.

Nonionic Surfactant

A nonionic surfactant, which is in a solid state at ambient temperature (23° C.) and has an HLB (Hydrophilic-Lipophilic Balance) value of 2.0 or greater, is used as the nonionic surfactant. Examples of such nonionic surfactants include sorbitan fatty acid esters, nonionic reactive surfactants (such as polyoxyalkylene alkenyl ethers), and glycerin fatty acid esters. These nonionic surfactants may be used alone or in combination of two or more thereof as long as the object of the present invention is not impaired.

Note that if the nonionic surfactant is in a liquid state or has an HLB value of less than 2.0, the thermally conductive elastomer composition will have insufficient insulating properties or poor oil bleeding resistance (increases the amount of oil bleeding).

Specific nonionic surfactants include, for example, product name "RHEODOL SP-O30V" (sorbitan fatty acid ester, HLB value=4.7, solid (powder)); product name "LATEMUL PD-450" (polyoxyalkylene alkenyl ether, HLB value=16.2, solid); and product name "RHEODOL MS-50" (glycerin fatty acid ester, HLB value=2.8, solid) (all available from Kao Corporation).

In the thermally conductive elastomer composition, the nonionic surfactant is blended in an amount of 25 parts by mass or greater, and not greater than 40 parts by mass, and preferably not greater than 38 parts by mass relative to 100 parts by mass of the styrene-based elastomer. When the nonionic surfactant is blended in the amount within the range specified above, excellent reworkability and oil bleeding resistance are obtained.

Aluminum Hydroxide Powder

The aluminum hydroxide powder is an aggregate of particles formed of aluminum hydroxide and is used to impart thermal conductivity, and flame retardance, etc. to the thermally conductive elastomer composition. An average particle size of the aluminum hydroxide powder is not particularly limited as long as the object of the present invention is not impaired, but is preferably 1 μm or greater, more preferably 3 μm or greater, and even more preferably 5 μm or greater, and preferably not greater than 30 μm, more preferably not greater than 25 μm, and even more preferably not greater than 15 μm. A shape of the aluminum hydroxide powder is not particularly limited as long as the object of the present invention is not impaired, and for example, a generally available granular shape may be used.

The average particle size of the aluminum hydroxide powder is an average particle diameter (D50) based on volume according to a laser diffraction method. The average particle size can be measured with a laser diffraction particle diameter distribution meter. Note that the average particle size of the artificial graphite or the like described below is also the average particle diameter (D50) based on the volume according to the laser diffraction method.

In the present thermally conductive elastomer composition, the aluminum hydroxide powder is blended in an amount of 260 parts by mass or greater, preferably 265 parts by mass or greater, and more preferably 270 parts by mass or greater, and not greater than 640 parts by mass, and preferably not greater than 635 parts by mass relative to 100 parts by mass of the styrene-based elastomer. When the aluminum hydroxide powder is blended in the amount within the range specified above, excellent reworkability and oil bleeding resistance are obtained.

Artificial Graphite Powder

In the thermally conductive elastomer composition, a plate-shaped artificial graphite powder is preferably used as the thermally conductive filler. The artificial graphite powder is an aggregate of particles formed of artificial graphite. Artificial graphite is graphite obtained by heat-treating coke etc. at a high temperature of approximately 3000° C., which has less impurities and is highly pure as compared with natural graphite. Known shapes of artificial graphite are plate shape and bulk shape. Examples of commercially available plate-shaped artificial graphite include product names "UF-G5", "UF-G10", and "UF-G30" available from Showa Denko K.K., and product names "AGB-32" and "AG-130" available from Ito Graphite Co., Ltd. In contrast, examples of commercially available bulk artificial graphite include product names "AGB-60", "AG.B", and "AGB-5" available from Ito Graphite Co., Ltd.

The preferred artificial graphite powder used in the thermally conductive elastomer composition is plate-shaped and has an average particle size from 8 μm to 30 μm. Examples of commercially available products of such artificial graphite powder include product name "UF-G30" (average particle size: 10 μm) available from Showa Denko K.K.

An average particle size of the artificial graphite powder used in the thermally conductive elastomer composition is preferably from 8 μm to 20 μm, and more preferably from 8 μm to 15 μm.

A bulk specific gravity (g/cm$^3$) of the artificial graphite powder used in the thermally conductive elastomer composition is preferably from 0.25 to 0.35 g/cm$^3$.

Note that the artificial graphite powder is self-lubricating, and has a coefficient of friction of 0.06. From this perspective, the thermally conductive filler used preferably has a coefficient of friction of not greater than 0.20, and particularly preferably not greater than 0.10.

In the thermally conductive elastomer composition, the artificial graphite powder is blended in an amount of 250 parts by mass or greater, and preferably 255 parts by mass or greater, and not greater than 340 parts by mass, preferably not greater than 335 parts by mass, and more preferably not greater than 330 parts by mass relative to 100 parts by mass of the styrene-based elastomer. When the artificial graphite powder is blended in the amount within the range specified above, excellent reworkability and oil bleeding resistance are obtained.

Herein, expandable graphite obtained by chemically treating flaky natural graphite and expanded graphite obtained by heating expandable graphite at a high temperature are not included in artificial graphite. The artificial graphite herein is non-expandable.

In the thermally conductive elastomer composition, a total amount (parts by mass) of the thermally conductive fillers that are blended (the aluminum hydroxide powder and the artificial graphite powder) is preferably from 20 times to 27 times the amount (parts by mass) of the nonionic surfactant blended.

Other Additives

The thermally conductive elastomer composition may further include a metal deactivator and an antioxidant.

The metal deactivator is not particularly limited as long as the object of the present invention is not impaired, and for example, N'1,N'12-bis(2-hydroxybenzoyl) dodecane hydrazide is used. In the thermally conductive elastomer composition, the metal deactivator is blended in an amount of preferably 3.8 parts by mass or greater and not greater than 6 parts by mass relative to 100 parts by mass of the styrene-based elastomer.

The antioxidant is not particularly limited as long as the object of the present invention is not impaired, and for example, a hindered phenol-based antioxidant, and an amine-based antioxidant are used. In the thermally conductive elastomer composition, the antioxidant is blended in an amount of preferably 3.8 parts by mass or greater and not greater than 6 parts by mass relative to 100 parts by mass of the styrene-based elastomer.

As long as the object of the present invention is not impaired, the thermally conductive elastomer composition may further contain an ultraviolet light blocking agent, a coloring agent (pigment or dye), a thickening agent, a filler, a thermoplastic resin other than olefin-based resins, a surfactant, and the like. Note that the thermally conductive elastomer composition preferably does not contain an olefin-based resin as the oil component. When the thermally conductive elastomer composition does not contain an olefin-based resin as the oil component, the oil bleeding resistance of the composition is easily ensured.

The thermally conductive elastomer composition described above and the thermally conductive molded article produced therefrom have excellent reworkability. In other words, tackiness (stickiness) of surfaces of the thermally conductive elastomer composition and the thermally conductive molded article can be suppressed, and, for example, even when the thermally conductive molded articles overlap, they can be peeled away from each other. Such a thermally conductive molded article is improved in dimensional accuracy and productivity. Furthermore, the thermally conductive molded article has excellent reworkability (low tackiness), and, when the thermally conductive molded article is applied to a target, formation of air bubbles between the target and the thermally conductive molded article is suppressed, and a reduction in thermal conductivity is suppressed. Furthermore, the thermally conductive elastomer composition and the thermally conductive molded article have excellent oil bleeding resistance, thermal conductivity, insulating properties, low hardness, moldability, and the like.

A thermal conductivity of the thermally conductive elastomer composition is preferably 0.60 W/m·K or greater. An upper limit of the thermal conductivity of the thermally conductive elastomer composition is not particularly limited, and is, for example, not greater than 1.0 W/m·K.

A volume resistivity of the thermally conductive elastomer composition is preferably $1 \times 10^{12}$ Ω·cm or greater.

A hardness (Asker C) of the thermally conductive elastomer composition is preferably from 7 to 13. When the hardness (Asker C) of the thermally conductive elastomer composition is within this range, undesired load is prevented from being applied to the target (for example, the substrate) of the heat countermeasure. The thermally conductive elastomer composition also has a function of absorbing vibration, shock, or the like to protect the target.

A specific gravity of the thermally conductive elastomer composition is not particularly limited as long as the object of the present invention is not impaired, but, for example, is preferably from 1.15 to 1.36 g/cm³.

Thermally Conductive Molded Article

The thermally conductive molded article is formed by molding the thermally conductive elastomer composition into a predetermined shape. A method of molding the thermally conductive molded article is not particularly limited as long as it is a general molding method for a thermoplastic elastomer (for example, a styrene-based elastomer), and examples thereof include injection molding and sheet molding using a press or T die.

The thermally conductive molded article is used, for example, as a member (thermally conductive member) for releasing heat emitted from electronic components or the like in the electronic device to the outside. The thermally conductive molded article is used for the purpose of the heat countermeasure, protection, or the like of a substrate in the electronic device or the like.

Examples of the electronic devices in which the thermally conductive molded article is used include mobile devices such as smartphones, portable gaming devices, portable televisions, tablet terminals, and other devices other than portable devices.

FIG. 1 is a side view schematically illustrating an example of a thermally conductive molded article 10. The thermally conductive molded article 10 is formed of a thermally conductive elastomer composition as a material and molded by using a predetermined mold. The thermally conductive molded article 10 generally includes a generally flat cuboid body 11 and a plurality of accommodating units 12, 13, 14, and 15 recessed on the back surface side. Each of the accommodating units 12, 13, 14, and 15 is formed in accordance with the shape of the heat dissipation target.

Figure 2:
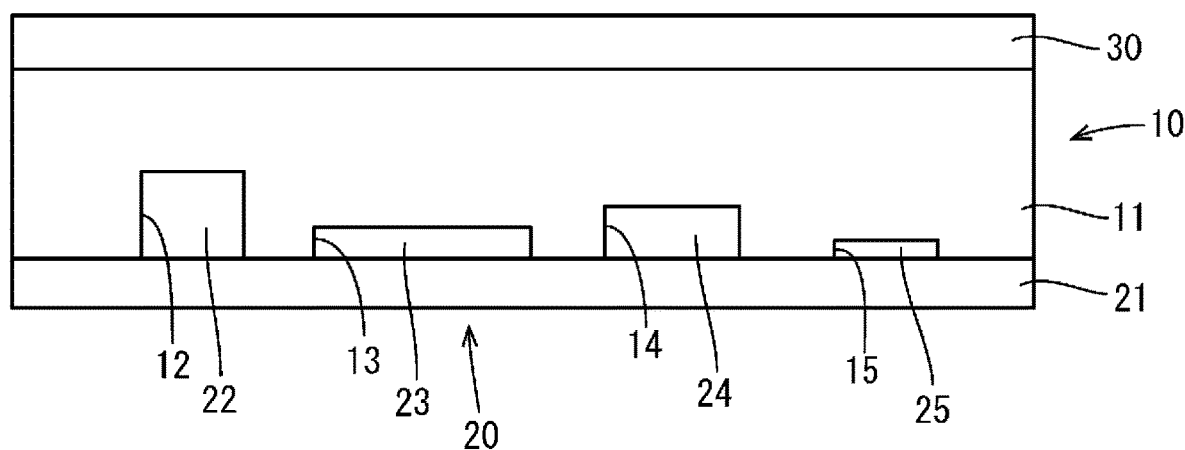
FIG. 2 is a cross-sectional view schematically illustrating a state in which the thermally conductive molded article is mounted on a heat dissipation target.

FIG. 2 is a cross-sectional view schematically illustrating a state in which the thermally conductive molded article 10 is mounted on a heat dissipation target 20. The thermally conductive molded article 10 is mounted in a state of being mounted on a substrate device that is a heat dissipation target 20. The substrate device includes a substrate 21 and a plurality of electronic components 22, 23, 24, and 25 mounted on the substrate 21. Each of the accommodating units 12, 13, 14, and 15 of the thermally conductive molded article 10 is covered in a state of being adhered to the electronic components (heat-generating units) 22, 23, 24, and 25 on the substrate 21. Note that a metal heat sink 30 is mounted on the front side of the thermally conductive molded article 10. The heat generated from each of the electronic components 22 and the like of the heat dissipation target 20 moves to the thermally conductive molded article 10 and moves further to the heat sink 30, thereby cooling the electronic components 22 and the like of the heat dissipation target 20.

As described above, the thermally conductive molded article is provided with a shape corresponding to the shape of the heat dissipation target, and it is possible to reliably adhere to the heat dissipation target to perform heat countermeasure, protection, or the like.

The shape of the thermally conductive molded article may be appropriately set depending on the purpose, and may be, for example, a sheet shape.

EXAMPLES

The present invention will be described below in more detail based on examples. The present invention is not limited to these examples.

Examples 1 to 4 and Comparative Examples 1 to 8

Production of Composition

A process oil 1 or a process oil 2, a nonionic surfactant 1 or an olefin-based resin, a metal deactivator, an antioxidant, aluminum hydroxide, and artificial graphite were blended in the proportions (parts by mass) indicated in Table 1 relative to 100 parts by mass of a styrene-based elastomer, and the mixture was kneaded under the conditions of 100 rpm and 200° C. for 7 minutes by using LABO PLASTOMILL (twin screw extruder, product name "4C150-1", available from Toyo Seiki Seisaku-sho, Ltd.), thereby obtaining compositions of Examples 1 to 4 and Comparative Examples 1 to 8.

Note that the materials used in each of the examples and comparative examples were as follows:

"Styrene-based elastomer": SEEPS, product name "SEPTON 4055", available from Kuraray Co., Ltd.

"Process oil 1": Petroleum-based hydrocarbon (paraffin-based process oil), weight average molecular weight (Mw) =533, product name "Diana Process Oil PW-90", available from Idemitsu Kosan Co., Ltd.

"Process oil 2": Petroleum-based hydrocarbon (paraffin-based process oil), weight average molecular weight (Mw) =735, product name "Diana Process Oil PW-380", available from Idemitsu Kosan Co., Ltd.

"Nonionic surfactant 1": Sorbitan fatty acid ester, HLB value=4.7, solid (powder), product name "RHEDOL SP-030V", available from Kao Corporation "Olefin-based resin": Ethylene propylene copolymer, product name "Prime Polypro J2021GR", available from Prime Polymer Co., Ltd.

"Metal deactivator": N'1,N'12-bis(2-hydroxybenzoyl) dodecane hydrazide, product name "ADK STAB CDA-6", available from ADEKA Corporation "Antioxidant": Pentaerythritol tetrakis[3-(3,5-di-tert-butyl-4-hydroxyphenyl) propionate] (hindered phenol-based antioxidant), product name "IRGANOX #1010", available from BASF Japan Ltd.

"Aluminum hydroxide": Average particle size: 10 μm, spherical, product name "BF083", available from Nippon Light Metal Co., Ltd.

"Artificial graphite": Plate shape, average particle size of 10 μm, true specific gravity: 2.2 g/cm³, bulk specific gravity: 0.3 g/cm³, plate shape, product name "UF-G30", available from Showa Denko K.K.

Production of Molded Article

A mold set in a 50-ton press machine (product name "hydraulic molding machine type C", manufactured by IWAKI INDUSTRY Co., Ltd) was heated for 1 minute at 180° C., and then each of the compositions described above was fed into the mold. Next, the mold was heated at 180° C. for 1 minute while being pressed (pressing condition: about 2 ton), and then was cooled for 2 minutes while being pressed by a cooling press at room temperature. Then, the sheet-shaped molded article (60 mm×60 mm×6 mm) was removed from the mold after cooling. In this way, a molded article (thickness: 6 mm) formed of the compositions of Examples 1 to 4 and Comparative Examples 1 to 8 was obtained.

Furthermore, a molded article (thickness: 1 mm) formed of each of the compositions of Examples 1 to 4 and Comparative Examples 1 to 8 was obtained by the same method as described above, except that a mold for producing a molded article having a thickness of 1 mm was used in place of the mold described above.

Furthermore, a molded article (thickness: 12 mm) formed of each of the compositions of Examples 1 to 4 and Comparative Examples 1 to 8 was obtained by the same method as described above, except that a mold for producing a molded article having a thickness of 12 mm was used in place of the mold described above.

Evaluation

The hardness, thermal conductivity, volume resistivity, specific gravity, moldability, flame retardance, reworkability, and oil bleeding resistance were evaluated by methods described below for the molded articles of Examples 1 to 4 and Comparative Examples 1 to 8.

Hardness

A test piece for measurement of the hardness (60 mm×30 mm×12 mm) was cut out from the molded article (thickness: 12 mm) of each example or the like into a size of 60 mm×30 mm×12 mm. In addition, a constant pressure load device for a rubber hardness meter (available from Elastron, Inc.) and an Asker C hardness meter were prepared. A pressing needle of the hardness meter was brought into contact with the test piece, the value of the hardness meter was read 30 seconds after all the loads were applied, and the value was taken as the hardness (Asker C). The results are indicated in Table 1.

Thermal Conductivity

A set of pieces cut out from the molded article (thickness: 12 mm) of each example or the like into a size of 30 mm×30 mm×12 mm were prepared. Then, a polyimide sensor was held between the set of test pieces, and the thermal conductivity (W/mK) was measured by a hot disk method. Note that a hot disk thermal property measuring apparatus (product name "TPS500", available from Hot Disk) was used for the measurement. The results are indicated in Table 1.

Volume Resistivity

The molded article (thickness: 1 mm) of each example or the like was used as a test piece (60 mm×60 mm×1 mm). The volume resistivity (Ω·cm) of each test piece was measured by using a measuring apparatus (product name "Hiresta-UP (MCP-HT450)", available from Mitsubishi Chemical Corporation). Note that a probe used for the measurement was URS, the applied voltage was 1000 V, and the time (timer) was 10 seconds. The results are indicated in Table 1.

Specific Gravity

The specific gravity (g/cm³) of the molded article of each example or the like was measured by using a specific gravity measurement balance (product name "AG204", available from Mettler-Toledo International Inc.). The specific gravity calculation formula is as follows. The results are indicated in Table 1. Specific gravity=mass of molded article in atmosphere/(mass of molded article in atmosphere−mass of molded article in water)

Moldability

The moldability was determined by whether or not the molded article was easily detached from the mold during molding of the molded article of each example or the like described above. In a case where the molded article was easily and smoothly detached from the mold, the molded article was determined as having "very good moldability"; in a case where the molded article was easily, but not smoothly, detached from the mold, the molded article was determined as having "good moldability"; in a case where the molded article was not easily detached from the mold, the molded article was determined as having "poor moldability". The results are indicated in Table 1. Note that in Table 1, the "very good moldability" was evaluated as "good", the "good moldability" was evaluated as "marginal", and the "poor moldability" was evaluated as "fail".

Flame Retardancy

The flame retardance was evaluated in the same manner as in UL94 HB Horizontal Burn test for the molded article (thickness: 1 mm) of each example or the like or the like. The results are indicated in Table 1.

Reworkability

The molded article (thickness: 1 mm) of each example or the like was folded in half, and the molded article itself was overlapped. The molded article was left in the half-folded state for 1 minute (under the condition: room temperature of 23° C.), and then the overlapped portions were checked for whether a tester could peel them away from each other by hand. In a case where the tester could peel them away from each other by hand, the molded article was determined as "reworkable", and in a case where the tester could not peel them away from each other by hand, the molded article was determined as "non-reworkable". The results are indicated in Table 1. Note that in Table 1, the "reworkable" is evaluated as "good", and the "non-reworkable" is evaluated as "fail".

Oil Bleeding Resistance

A test piece for evaluation of oil bleeding was cut out from the molded article (thickness: 6 mm) of each example or the like into a size of 10 mm×10 mm×6 mm. The test piece was left at rest on a medicine paper and placed in a thermostatic bath at 80° C. for 3 days. Thereafter, the test piece placed on the medicine paper was taken out from the thermostatic bath, and an amount of oil oozing into the medicine paper was visually checked. In a case where the amount of oozing oil was small, the molded article was determined as having "excellent oil bleeding resistance", and in a case where the amount of oozing is large, the molded article was determined as having "poor oil bleeding resistance". The results are indicated in Table 1. Note that in Table 1, the "excellent oil bleeding resistance" is evaluated as "good", and the "poor oil bleeding resistance" is evaluated as "fail". A level (large or small) of the amount of oil bleeding was determined based on a width (width in an oozing direction) of an area where a color of the medicine paper changed. Specifically, in a case where the width in the oozing direction of oil bleed (planar direction of the medicine paper) was not greater than 25 mm, the molded article was determined as having "excellent oil bleeding resistance", and in a case where the width in the oozing direction of oil bleed exceeded 25 mm, the molded article was determined as having "poor oil bleeding resistance".

Example 2 had low thermal conductivity, no reworkability, and poor oil bleeding resistance.

The molded article of Comparative Example 3 is a case where the amount of the process oil 1 blended and the

TABLE 1

| | Examples | | | | Comparative Example | | | | | | | |
|---|---|---|---|---|---|---|---|---|---|---|---|---|
| | 1 | 2 | 3 | 4 | 1 | 2 | 3 | 4 | 5 | 6 | 7 | 8 |
| Styrene-based elastomer | 100 | 100 | 100 | 100 | 100 | 100 | 100 | 100 | 100 | 100 | 100 | 100 |
| Process oil 1 (Mw = 533) | 632.5 | 648.6 | 700.0 | 700.0 | 850.0 | 850.0 | 850.0 | 800.0 | 658.0 | 600.0 | 600.6 | |
| Process oil 2 (Mw = 735) | | | | | | | | | | | | 850.0 |
| Nonionic surfactant 1 | 26.0 | 28.6 | 36.0 | 31.7 | | | 32.0 | 30.8 | 28.0 | 24.4 | 26.8 | |
| Olefin-based resin | | | | | 19.8 | | | | | | | 19.8 |
| Metal deactivator | 3.90 | 4.29 | 5.41 | 4.76 | 4.75 | 4.70 | 4.80 | 4.62 | 4.20 | 3.66 | 4.02 | 4.75 |
| Antioxidant | 3.90 | 4.29 | 5.41 | 4.76 | 4.75 | 4.70 | 4.80 | 4.62 | 4.20 | 3.66 | 4.02 | 4.75 |
| AL hydroxide (10 μm, spherical) | 272.7 | 314.3 | 630.6 | 460.3 | 252.0 | 252.0 | 252.0 | 251.5 | 252.4 | 231.7 | 253.0 | 252.0 |
| Artificial graphite powder (10 μm, plate shape) | 259.7 | 328.6 | 324.3 | 285.7 | 353.0 | 353.0 | 353.0 | 350.8 | 351.7 | 256.1 | 353.7 | 353.0 |
| Hardness (Asker C) | 10 | 12 | 11 | 9 | 12 | 6 | 5.5 | 7 | 11 | 11 | 15 | 11 |
| Thermal conductivity (W/m · K) | 0.61 | 0.71 | 0.78 | 0.66 | 0.58 | 0.59 | 0.56 | 0.65 | 0.71 | 0.63 | 0.77 | 0.64 |
| Volume resistivity (Ω · cm) | $1 \times 10^{13}$ | $1 \times 10^{12}$ | $1 \times 10^{12}$ | $1 \times 10^{13}$ | $1 \times 10^{12}$ | $1 \times 10^{12}$ | $1 \times 10^{12}$ | $6 \times 10^{11}$ | $2 \times 10^{9}$ | $2 \times 10^{7}$ | $5 \times 10^{8}$ | $1 \times 10^{12}$ |
| Specific gravity (g/cm$^3$) | 1.19 | 1.20 | 1.31 | 1.24 | 1.13 | 1.14 | 1.14 | 1.15 | 1.19 | 1.16 | 1.20 | 1.14 |
| Moldability | Good | Good | Good | Good | Good | Good | Good | Good | Good | Good | Good | Marginal |
| Flame retardance (UL94 HB) | HB | HB | HB | HB | HB | HB | HB | HB | HB | HB | HB | HB |
| Reworkability | Good | Good | Good | Good | Good | Fail | Good | Good | Good | Good | Good | Fail |
| Oil bleeding resistance | Good | Good | Good | Good | Fail | Fail | Fail | Fail | Good | Good | Good | Fail |

The molded articles of Examples 1 to 4 are cases where the process oil 1 (weight average molecular weight: 533) was used and nonionic surfactant 1 was used. In the molded articles of Examples 1 to 4, the amount of the process oil 1 used was set to be smaller than that of Comparative Example 1 or the like. As indicated in Table 1, the molded articles of Examples 1 to 4 had excellent reworkability and oil bleeding resistance. In the molded articles of Examples 1 to 4, the amount of the process oil 1 used was small, but the hardness was suppressed to be low. In addition, as indicated in Table 1, the molded articles of Examples 1 to 4 were confirmed to have excellent thermal conductivity, insulating properties, moldability, flame retardance, and the like. Note that in the molded articles of Examples 1 to 4, an olefin-based resin (see Comparative Examples 1 and 8) was not used.

The molded article of Comparative Example 1 is a case where the amount of the process oil 1 blended (weight average molecular weight: 533) and the amount of the artificial graphite powder blended were too large, and the amount of the aluminum hydroxide powder blended was too small. Note that the molded article of Comparative Example 1 contained an olefin-based resin which was not used in Example 1 or the like. The molded article of Comparative Example 1 had low thermal conductivity and poor oil bleeding resistance.

The molded article of Comparative Example 2 is a case where the amount of the process oil 1 blended and the amount of the artificial graphite powder blended were too large, and the amount of the aluminum hydroxide powder blended was too small. Furthermore, Comparative Example 2 did not contain the nonionic surfactant 1. The molded article of Comparative Example 2 had the hardness that was too low. Furthermore, the molded article of Comparative amount of the artificial graphite powder blended were too large, and the amount of the aluminum hydroxide powder blended was too small. The molded article of Comparative Example 3 had the hardness that was too low, as well as low thermal conductivity and poor oil bleeding resistance.

The molded article of Comparative Example 4 is a case where the amount of the process oil 1 blended and the amount of the artificial graphite powder blended were too large, and the amount of the aluminum hydroxide powder blended was too small. The molded article of Comparative Example 4 had low volume resistivity, problems with insulating properties, and poor oil bleeding resistance.

The molded article of Comparative Example 5 is a case where the amount of the artificial graphite powder blended was too large, and the amount of the aluminum hydroxide powder blended was too small. The molded article of Comparative Example 5 had low volume resistivity and problems with insulating properties.

The molded article of Comparative Example 6 is a case where the amount of the process oil 1 blended and the amount of the aluminum hydroxide powder blended were too low. The molded article of Comparative Example 6 had low volume resistivity and problems with insulating properties.

In the case of the molded article of Comparative Example 7, the amount of the process oil 1 blended was too small, the amount of the artificial graphite powder blended was too large, and the amount of the aluminum hydroxide powder blended was too small. The molded article of Comparative Example 7 had low volume resistivity and problems with insulating properties. Also, the molded article of Comparative Example 7 had the hardness that was too high.

The molded article of Comparative Example 8 used the process oil 2 having a large weight average molecular weight (weight average molecular weight: 735), and contained an olefin-based resin which was not used in Example 1 or the like. Also, the molded article of Comparative Example 8 is a case where the amount of the artificial graphite powder was too large, and the amount of the aluminum hydroxide powder was too small. The molded article of Comparative Example 8 had no reworkability and poor oil bleeding resistance.

Examples 5 and 6 and Comparative Examples 9 to 15

Production of Composition

Compositions of Examples 5 and 6 and Comparative Examples 9 to 15 were obtained in the same manner as in Example 4 except that the nonionic surfactants shown below were blended in the proportions (parts by mass) indicated in Table 2, respectively, in place of the nonionic surfactant 1.

Note that the materials used in each of the examples and comparative examples are as follows:

"Nonionic surfactant 2": Polyoxyalkylene alkenyl ether, HLB value=16.2, solid, product name "LATEMUL PD-450", available from Kao Corporation "Nonionic surfactant 3": Glycerin fatty acid ester, HLB value=2.8, solid, product name "RHEDOL MS-50", available from Kao Corporation "Nonionic surfactant 4": Polyoxyethylene alkyl ether, HLB value=13.6, liquid, product name "EMULGEN 109P", available from Kao Corporation "Nonionic surfactant 5": Sorbitan acid ester, HLB value=1.8, liquid, product name "RHEDOL SP-030V", available from Kao Corporation "Nonionic surfactant 6": Sorbitan acid ester, HLB value =8.6, liquid, product name "RHEDOL SP-L10", available from Kao Corporation "Nonionic surfactant 7": Polyoxyethylene sorbitan acid ester, HLB value=9.6, liquid, product name "RHEDOL TW-S106V", available from Kao Corporation "Nonionic surfactant 8": Polyoxyethylene alkylamine, HLB value=6.3, liquid, product name "AMIET 102", available from Kao Corporation "Nonionic surfactant 9": Alkyl alkanolamide, HLB value=5.8, liquid, product name "AMINON PK-02S", available from Kao Corporation "Nonionic surfactant 10": Polyoxyethylene fatty acid ester, HLB value=11.6, liquid, product name "EMANON 4110", available from Kao Corporation Production of Molded Article The compositions of Examples 5 and 6 and Comparative Examples 9 to 15 were used, and molded articles (thickness: 6 mm, 1 mm, or 12 mm) formed from the compositions of Examples 5 and 6 and Comparative Examples 9 to 15 were obtained by the same method as in Example 1 and the like.

Evaluation

The hardness, thermal conductivity, volume resistivity, specific gravity, moldability, flame retardance, reworkability, and oil bleeding resistance were evaluated by methods described below for the molded articles of Examples 5 and 6 and Comparative Examples 9 to 15. The results are indicated in Table 2.

TABLE 2

| | Examples | | | Comparative Example | | | | | | |
|---|---|---|---|---|---|---|---|---|---|---|
| | 4 | 5 | 6 | 9 | 10 | 11 | 12 | 13 | 14 | 15 |
| Styrene-based elastomer | 100 | 100 | 100 | 100 | 100 | 100 | 100 | 100 | 100 | 100 |
| Process oil 1 (Mw = 533) | 700.0 | 700.0 | 700.0 | 700.0 | 700.0 | 700.0 | 700.0 | 700.0 | 700.0 | 700.0 |
| Nonionic surfactant 1 (HLB = 4.7, solid) | 31.7 | | | | | | | | | |
| Nonionic surfactant 2 (HLB = 16.2, solid) | | 31.7 | | | | | | | | |
| Nonionic surfactant 3 (HLB = 2.8, solid) | | | 31.7 | | | | | | | |
| Nonionic surfactant 4 (HLB = 13.6, liquid) | | | | 31.7 | | | | | | |
| Nonionic surfactant 5 (HLB = 1.8, liquid) | | | | | 31.7 | | | | | |
| Nonionic surfactant 6 (HLB = 8.6, liquid) | | | | | | 31.7 | | | | |
| Nonionic surfactant 7 (HLB = 9.6, liquid) | | | | | | | 31.7 | | | |
| Nonionic Surfactant 8 (HLB = 6.3, liquid) | | | | | | | | 31.7 | | |
| Nonionic surfactant 9 (HLB = 5.8, liquid) | | | | | | | | | 31.7 | |
| Nonionic surfactant 10 (HLB = 11.6, liquid) | | | | | | | | | | 31.7 |
| Metal deactivator | 4.76 | 4.76 | 4.76 | 4.76 | 4.76 | 4.76 | 4.76 | 4.76 | 4.76 | 4.76 |
| Antioxidant | 4.76 | 4.76 | 4.76 | 4.76 | 4.76 | 4.76 | 4.76 | 4.76 | 4.76 | 4.76 |
| AL hydroxide (10 μm, spherical) | 460.3 | 460.3 | 460.3 | 460.3 | 460.3 | 460.3 | 460.3 | 460.3 | 460.3 | 460.3 |
| Artificial graphite powder (10 μm, plate shape) | 285.7 | 285.7 | 285.7 | 285.7 | 285.7 | 285.7 | 285.7 | 285.7 | 285.7 | 285.7 |
| Hardness (Asker C) | 9 | 13 | 13 | 9 | 8 | 8 | 9.5 | 8 | 8 | 9 |
| Thermal conductivity (W/m · K) | 0.66 | 0.68 | 0.68 | 0.67 | 0.67 | 0.67 | 0.67 | 0.68 | 0.74 | 0.72 |
| Volume resistivity (Ω · cm) | $1 \times 10^{13}$ | $1 \times 10^{13}$ | $1 \times 10^{13}$ | $6 \times 10^{11}$ | $1 \times 10^{13}$ | $7 \times 10^{10}$ | $3 \times 10^{11}$ | $7 \times 10^{10}$ | $5 \times 10^{9}$ | $2 \times 10^{11}$ |

TABLE 2-continued

|  | Examples | | | Comparative Example | | | | | | |
| --- | --- | --- | --- | --- | --- | --- | --- | --- | --- | --- |
|  | 4 | 5 | 6 | 9 | 10 | 11 | 12 | 13 | 14 | 15 |
| Specific gravity (g/cm³) | 1.24 | 1.23 | 1.23 | 1.21 | 1.23 | 1.23 | 1.23 | 1.23 | 1.22 | 1.22 |
| Moldability | Good | Good | Good | Good | Good | Good | Good | Good | Good | Good |
| Flame retardance (UL94 HB) | HB | HB | HB | HB | HB | HB | HB | HB | HB | HB |
| Reworkability | Good | Good | Good | Good | Fail | Good | Good | Good | Good | Good |
| Oil bleeding resistance | Good | Good | Good | Good | Good | Good | Good | Good | Good | Good |

As indicated in Table 2, the molded article of Example 5 is a case where the nonionic surfactant 2 was used, and the molded article of Example 6 is a case where the nonionic surfactant 3 was used. Examples 5 and 6 are completely identical with Example 4 and the like, except the components blended other than the nonionic surfactant 2. Examples 5 and 6 exhibited excellent reworkability and oil bleeding resistance, similarly to Example 4 and the like. Note that the molded articles of Examples 5 and 6 were confirmed to have excellent thermal conductivity, insulating properties, moldability, flame retardance, and the like as indicated in Table 2.

Comparative Example 9 is a case where the liquid nonionic surfactant 4 was used. The molded article of Comparative Example 9 had low volume resistivity and problems with insulating properties.

Comparative Example 10 is a case where the liquid nonionic surfactant 5 having an HLB value of 1.8 was used. The molded article of Comparative Example 10 had problems with reworkability.

Comparative Examples 11 to 15 are cases where a liquid nonionic surfactant was used. Each of the molded articles of Comparative Examples 11 to 15 had low volume resistivity and problems with insulating properties.

REFERENCE SIGNS LIST

10: Thermally conductive molded article; 11: Body; 12, 13, 14, 15: Accommodating unit; 20: Heat dissipation target (substrate device); 21: Substrate; 22, 23, 24, 25: Electronic component (heat-generating unit); 30: Heat sink.

The invention claimed is:

1. A thermally conductive elastomer composition comprising:
   100 parts by mass of a styrene-based elastomer;
   from 610 to 750 parts by mass of a process oil formed of a petroleum-based hydrocarbon, the process oil having a weight average molecular weight of not greater than 600;
   from 25 to 40 parts by mass of a solid nonionic surfactant having an HLB value of 2.0 or greater;
   from 260 to 640 parts by mass of aluminum hydroxide powder; and
   from 250 to 340 parts by mass of artificial graphite powder.

2. The thermally conductive elastomer composition according to claim 1, wherein
   the aluminum hydroxide powder has an average particle size from 1 μm to 30 μm; and
   the artificial graphite powder has an average particle size from 8 μm to 30 μm.

3. The thermally conductive elastomer composition according to claim 1, which does not contain an olefin-based resin.

4. A thermally conductive molded article obtained by molding the thermally conductive elastomer composition described in claim 1.

* * * * *